United States Patent
Choi et al.

(10) Patent No.: US 7,419,857 B2
(45) Date of Patent: Sep. 2, 2008

(54) METHOD FOR MANUFACTURING FIELD EFFECT TRANSISTOR HAVING CHANNEL CONSISTING OF SILICON FINS AND SILICON BODY AND TRANSISTOR STRUCTURE MANUFACTURED THEREBY

(75) Inventors: Yang-Kyu Choi, Daejeon (KR); Hyunjin Lee, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 322 days.

(21) Appl. No.: 11/312,111

(22) Filed: Dec. 20, 2005

(65) Prior Publication Data

US 2007/0141763 A1    Jun. 21, 2007

(51) Int. Cl.
*H01L 21/84* (2006.01)
(52) U.S. Cl. .................. 438/157; 438/283; 438/285; 257/E21.561
(58) Field of Classification Search ......... 438/151–166, 438/283, 285
See application file for complete search history.

(56) References Cited

U.S. PATENT DOCUMENTS

2005/0161739 A1 *   7/2005   Anderson et al. ........... 257/347

* cited by examiner

*Primary Examiner*—Richard A. Booth
(74) *Attorney, Agent, or Firm*—Klaus P. Stoffel; Wolf & Samson PC

(57) ABSTRACT

Discloses are a method for manufacturing a field effect transistor comprising a channel consisting of silicon fins and a silicon body, in which the silicon fins have an orientation different from the silicon body, as well as a transistor structure manufactured thereby. The method comprises the steps of: (a) forming a hard mask pattern on a substrate comprising a silicon thin film; (b) anisotropically etching the silicon thin film to a predetermined thickness using the hard mask pattern as a mask so as not only to form silicon fins where a channel is to be formed and a silicon pattern where a source/drain region is to be formed, but also to form a silicon body that connects the silicon fins to each other to form a channel; (c) partially etching the silicon thin film using an active mask so as to isolate the source/drain region and the device from each other; and (d) growing a gate dielectric film around the silicon channel and sequentially depositing a gate material and a gate mask on the resulting structure, followed by forming a gate region.

5 Claims, 10 Drawing Sheets

(a)

(b)

METHOD FOR MANUFACTURING FIELD EFFECT TRANSISTOR HAVING CHANNEL CONSISTING OF SILICON FINS AND SILICON BODY AND TRANSISTOR STRUCTURE MANUFACTURED THEREBY

BACKGROUND OF THE INVENTION

1. Field of the Invention

The present invention relates to a method for manufacturing a field effect transistor and a transistor structure manufactured by the method. More particularly, the present invention relates to a method for manufacturing a field effect transistor comprising a channel consisting of silicon fins and a silicon body having an orientation different from the silicon fins, as well as a field effect transistor manufactured by the method.

2. Background of the Related Art

Currently, in an attempt to reduce the price of semiconductor devices and to improve the device performance, the size of semiconductor devices has continued to decrease according to the Moore's law, thus enabling the high integration of semiconductor IC chips.

However, as the channel length of semiconductor devices decreases to less than 100 nm, the potential of a channel in the prior field effect transistors is controlled not only by a gate but also by a drain region so that a phenomenon where great leakage current flows between the source and drain regions will occur even when devices are in an off-state.

To reduce this short-channel effect, ultra-thin body (UTB) transistor structures using, as a channel, a body consisting of the thin silicon thin film of an SOI (Silicon-on-insulator) wafer, and transistor structures using two or more gates, have been proposed. In the case of using the thin film channel, the effects of depletion charge and capacitance are reduced so that the short-channel effect can be effectively reduced without additional channel doping. This can reduce the problem of a reduction in mobility, caused by impurity scattering.

The double-gate structure is a silicon thin-film field-effect transistor manufactured by the prior SOI (silicon-on-insulator) complementary metal oxide semiconductor (CMOS) processing. In this structure, a channel is formed by locating gates on both sides of a silicon channel formed vertically to a substrate such that the ability of gate voltage to control the channel potential is enhanced to reduce leakage current.

After this, fin field effect transistor structures having reduced deviation in device characteristics between wafers and effective insulation between devices, and manufacturing methods thereof, and body-tied omega FinFET structures using a bulk substrate instead of an SOI substrate to solve the heat transfer problem of the fin field effect transistors, and manufacturing methods thereof, have been developed.

As a substitute for a two-dimensional structure for controlling the potential of a silicon channel using one gate electrode above the channel, a three-dimensional double-gate or multiple-gate transistor structure has been proposed in which gates are located above and below or both sides of a channel so as to maximize the ability to control the channel potential by gate voltage, and a thin silicon fin is used.

However, in the case of this three-dimensional vertical gate using a fin shape channel, the channel is formed in a sidewall having a crystal orientation of (110), unlike the case of a horizontal transistor where a channel is formed in a silicon body having a crystal orientation of (100). The mobility of electrons shows the highest value on the (100) plane and is lower on the order of (111) and (110) planes, and the mobility of holes shows the highest value on the (110) planes and is lower on the order of (111) and (100) planes.

As a result, an N-type fin field effect transistor having a channel formed in the (110) plane has a lower mobility and current value than a case where a channel is formed in the (100) plane. Also, the fin field effect transistor has a problem in that it is complicated to correct the channel width in the layout of devices.

In an attempt to solve this problem, a field effect transistor having a silicon fin and body was proposed which is manufactured by a similar process to a manufacturing process of the prior SOI transistor in a simple manner.

Hereinafter, a method for forming a silicon thin-film field-effect transistor according to the prior art and problems in the method will be described with reference to the accompanying drawings.

FIG. 1 is a process perspective view sequentially showing a method for manufacturing a fin field-effect transistor having gates formed on both sides of a fin, according to the prior art.

As shown in FIG. 1, on an SOI substrate 101 comprising a silicon substrate, a buried oxide film 102 and a silicon thin film 103a, a hard mask 104a is formed (10A).

Then, lithography is used to form a silicon channel pattern

Then, oxidation and etching are carried out to reduce the width of the above-formed fin (100C).

After growing or depositing a dielectric film for a gate 107 and the material of the gate 107, the region of the gate is patterned and implanted with ions to form a source/drain extension region (100E).

After forming spacers 108 on both sides of the gate 107, a source/drain region is formed by ion implantation (100E).

Using a self-aligned silicide process, electrodes 109 are formed, thus manufacturing a fin field-effect transistor (100F).

The device manufactured by this method has a shortcoming in that it requires a large area because the channel width of the device must be increased to increase the current value of the device. Another problem is that it is complicated to correct the device channel width in the device layout.

FIG. 2 is a process cross-sectional view showing a prior art method for manufacturing fin field-effect transistors, in which a bulk substrate is used to reduce the variation in device characteristics between wafers and to effectively achieve the insulation between the devices.

As shown in FIG. 2, on a bulk wafer 203a, a hard mask blocking layer 202a and a hard mask cap layer 201a are sequentially deposited (200A).

After the deposition, the hard mask blocking layer 202 and the hard mask cap layer 201 are patterned using optical lithography to form fin patterns consisting of a hard mask blocking layer 202b and a hard mask cap layer 201b (200B).

Using the patterned hard mask cap layer 201b and a fin height control layer, the bulk silicon substrate 203c is anisotropically etched to the desired depth to control the height of the fins (200C).

To control the growth rate of the substrate between the silicon channel and the fin during oxidation, the silicon channel is covered with a hard mask blocking layer and implanted with ions to form a damage layer 204 between the fins (200D).

By oxidation, an oxide film 205 with a different thickness is formed, and by etching, the oxide film grown on the side of the silicon channel is removed to form a silicon channel 206 (200E).

A gate dielectric film and a gate material are grown or deposited, thus manufacturing fin field-effect transistors on the bulk substrate (200F).

This structure has a problem in that it is difficult to control the exact height of the silicon channel, compared to the case of using the SOI substrate, because the height control layer having damages caused by the implantation of heavy ions is used to control the height of the fins. Also, it has a problem in that it requires a large area because the channel width of the devices must be increased to increase the current value of the devices. Still another problem is that it is complicated to correct the channel width in the layout of the devices.

FIG. 3 is a process cross-sectional view showing a prior art method for manufacturing an omega fin field-effect transistor, in which a bulk substrate is used to solve the heat transfer problem of the fin field-effect transistor.

As shown in FIG. 3, a silicon channel is formed in a silicon substrate using a trench process, and oxidation and etching are used to control the width of a fin where a channel and a source/drain region are to be formed (300A).

An oxide film is grown and a nitride film is deposited (300B).

Chemical vapor deposition is used to deposit an oxide film (300C).

Chemical-mechanical polishing (CMP) is performed using the nitride film as an etch stop layer (300D).

The nitride film is wet-etched and then implanted with ions so as to be able to control critical voltage (300E).

A gate dielectric film and a gate material are grown or deposited, thus manufacturing an omega fin field-effect transistor on the bulk substrate (300F).

This structure has a problem in that it is difficult to control the exact height of the silicon channel, compared to the case of using the SOI substrate, because the trench process is used to control the height of the fin.

Also, it has a problem in that it requires a large area because the channel width of the device must be increased to increase the current value of the device. Still another problem is that it is complicated to correct the channel width in the layout of the device.

SUMMARY OF THE INVENTION

Accordingly, the present invention has been made to solve the above problems occurring in the prior art, and it is an object of the present invention is provide a method for manufacturing a field effect transistor comprising a channel consisting of silicon fins and a silicon body having an orientation different from the silicon fins, in which the silicon fins and the silicon body are formed by etching of silicon to a given thickness or by selective epitaxial growth of silicon.

Another object of the present invention is to provide a field effect transistor manufactured by said manufacturing method, which has increased current value and can be simply corrected for the channel width in the device layout.

To achieve the above objects, according to a first embodiment, the present invention provides a method for manufacturing a field effect transistor having a channel consisting of silicon fins and a silicon body, the method comprising the steps of: (a) forming a hard mask pattern on a substrate comprising a silicon thin film; (b) anisotropically etching the silicon thin film to a predetermined thickness using the mask pattern as a mask so as not only to form silicon fins where a channel is to be formed and a silicon pattern where a source/drain region is to be formed, but also to form a silicon body that connects the silicon fins to each other to form a channel; (c) partially etching the silicon thin film using an active mask so as to isolate the source/drain region and the device from each other; and (d) growing a gate dielectric film around the silicon channel and sequentially depositing a gate material and a gate mask on the resulting structure, followed by forming a gate region.

According to a second embodiment, the present invention provides a method for manufacturing a field effect transistor having a channel consisting of silicon fins and a silicon body, the method comprising the steps of: (a) forming a hard mask pattern on a substrate comprising a silicon thin film; (b) partially etching the silicon thin film using an active mask so as to isolate a source/drain region and the device from each other; (c) anisotropically etching the silicon thin film to a predetermined thickness using the mask pattern as a mask so as not only to form silicon fins where a channel is to be formed and a silicon pattern where a source/drain region is to be formed, but also to form a silicon body that connects the silicon fins to each other to form the channel; (d) growing a gate dielectric film around the silicon channel and sequentially depositing a gate material and a gate mask on the resulting structure, followed by forming a gate region.

According to a third embodiment, the present invention provides a method for manufacturing a field effect transistor having a channel consisting of silicon fins and a silicon body, the method comprising the steps of: (a) forming a substrate comprising a silicon thin film; (b) forming on the silicon thin film a film made of a material having a high etch selectivity, and etching the high etch selectivity film using a mask to form portions where silicon fins are to be formed; (c) forming silicon fins on said formed portions by selective epitaxial growth of silicon; (d) partially etching the silicon thin film using an active mask to isolate a source/drain region and the device from each other; and (e) growing a gate dielectric film around the and silicon channel and sequentially depositing a gate material and a gate mask on the resulting structure, followed by forming a gate region.

According to a fourth embodiment, the present invention provides a method for manufacturing a field effect transistor having a channel consisting of silicon fins and a silicon body, the method comprising the steps of: (a) forming a substrate comprising a silicon thin film; (b) partially etching the silicon thin film using an active mask to isolate a source/drain region and the device from each other; (c) forming on the silicon thin film a film made of material having a high etch selectivity, and etching and pattering the high etch selectivity film to form portions where silicon fins are to be formed; (d) forming silicon fins on said formed portions by selective epitaxial growth of silicon; and (e) growing a gate dielectric film around the silicon channel and sequentially depositing a gate material and a gate mask on the resulting structure, followed by forming a gate region.

According to a fifth embodiment, the present invention provides a method for manufacturing a field effect transistor having a channel consisting of silicon fins and a silicon body, the method comprising the steps of: (a) forming a substrate comprising a silicon thin film; (b) forming a hard mask on the silicon thin film, forming on the hard mask a polysilicon pattern, depositing on the resulting structure a film made of a material having a high etch selectivity, followed by etching the high etch selectivity film to form sidewalls on both sides of the polysilicon pattern; (c) etching the hard mask, the polysilicon and the silicon thin film to expose a buried oxide film so as to isolate the sidewalls as masks for forming silicon fins and the device from each other; (d) using the sidewalls and the hard mask to anisotropically etch the silicon thin film to form silicon fins where a channel is to be formed, while controlling the etching thickness of the silicon thin film to leave a thin silicon body between the silicon fins; and (e) growing a gate dielectric film around the silicon channel and sequentially depositing a gate material and a gate mask on the resulting structure, followed by forming a gate region.

According to a sixth embodiment, the present invention provides a method for manufacturing a field effect transistor having a channel consisting of silicon fins and a silicon body, the method comprising the steps of: (a) forming a substrate comprising a silicon thin film; (b) forming a hard mask on the silicon thin film, forming on the hard mask a polysilicon pattern, depositing on the resulting structure a film made of a material having a high etch selectivity, followed by etching the high etch selectivity film to form sidewalls on the polysilicon pattern; (c) etching the hard mask, the polysilicon and the silicon thin film to expose a buried oxide film so as to isolate the sidewalls as masks for forming silicon fins and the device from each other; (d) using the sidewalls and the hard mask to anisotropically etch the silicon thin film to form silicon fins where a channel is to be formed, while controlling the etching thickness of the silicon thin film to leave a thin silicon body between the silicon fins and to isolate the silicon fins and the silicon body from each other; and (e) growing a gate dielectric film around the silicon channel and sequentially depositing a gate material and a gate mask on the resulting structure, followed by forming a gate region.

In another aspect, the present invention provides a field effect transistor manufactured by any one of the methods according to the first to sixth embodiments, in which silicon fins and a silicon body are used as a channel.

BRIEF DESCRIPTION OF THE DRAWINGS

The above and other objects, features and advantages of the present invention will be more clearly understood from the following detailed description taken in conjunction with the accompanying drawings, in which:

FIG. 4b is an a-a' cross-sectional view of the device manufactured by the method shown in FIG. 4a;

DETAILED DESCRIPTION OF THE PREFERRED EMBODIMENT

Hereinafter, preferred embodiments of a method for manufacturing a field effect transistor comprising a channel consisting of silicon fins and a silicon body having an orientation different from the silicon fins will be described in detail with reference to the accompanying drawings. Although these embodiments will be described with respect to an SOI substrate, they also may use a substrate comprising silicon, such as a silicon bulk substrate, a strained silicon substrate or an SiGe substrate, in the same process as the SOI substrate.

Embodiment 1

Figure 1:
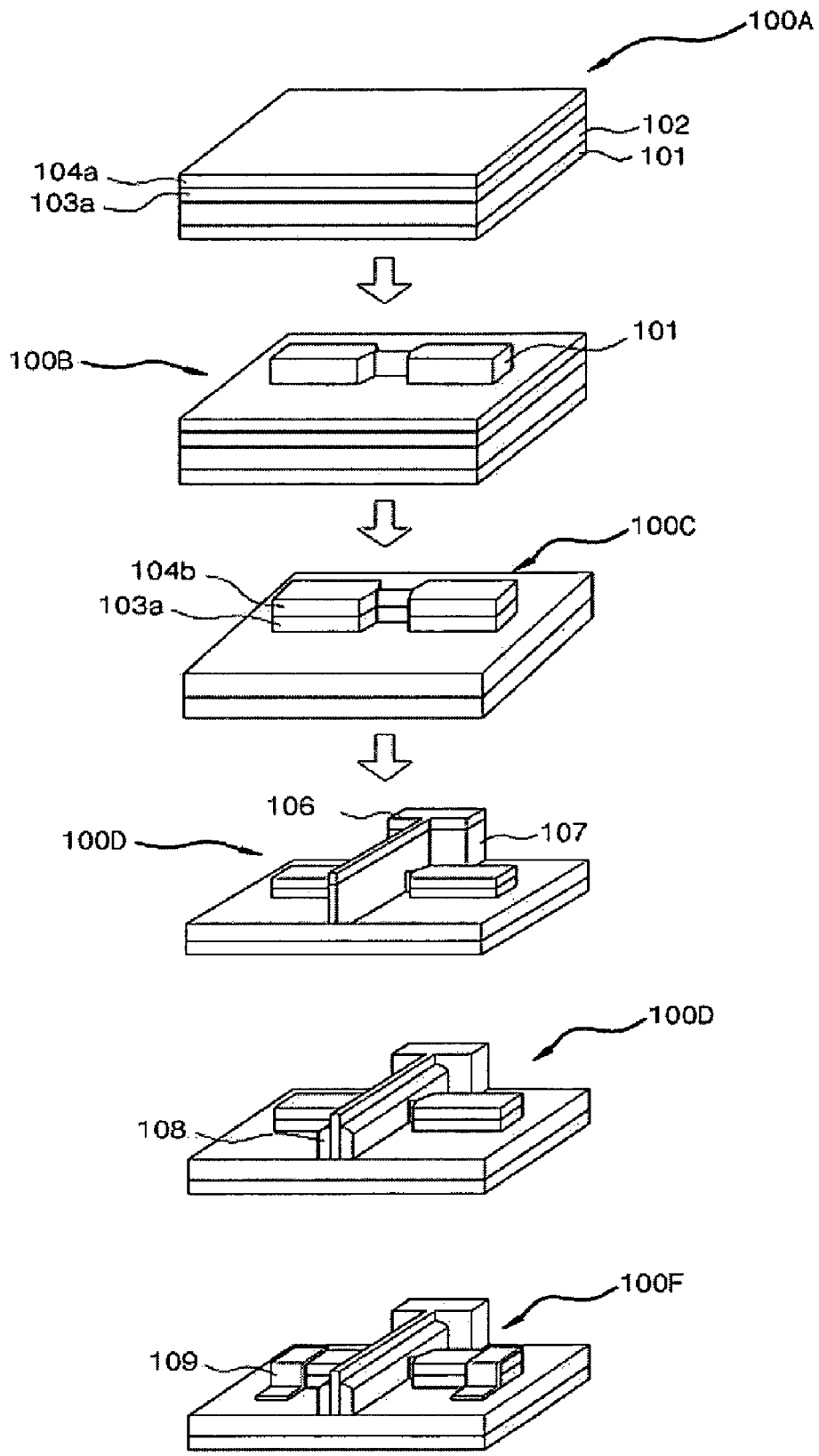
FIG. 1 is a process perspective view sequentially showing a method for manufacturing a fin field-effect transistor having gates formed on both sides of a fin, according to the prior art.
Figure 2:
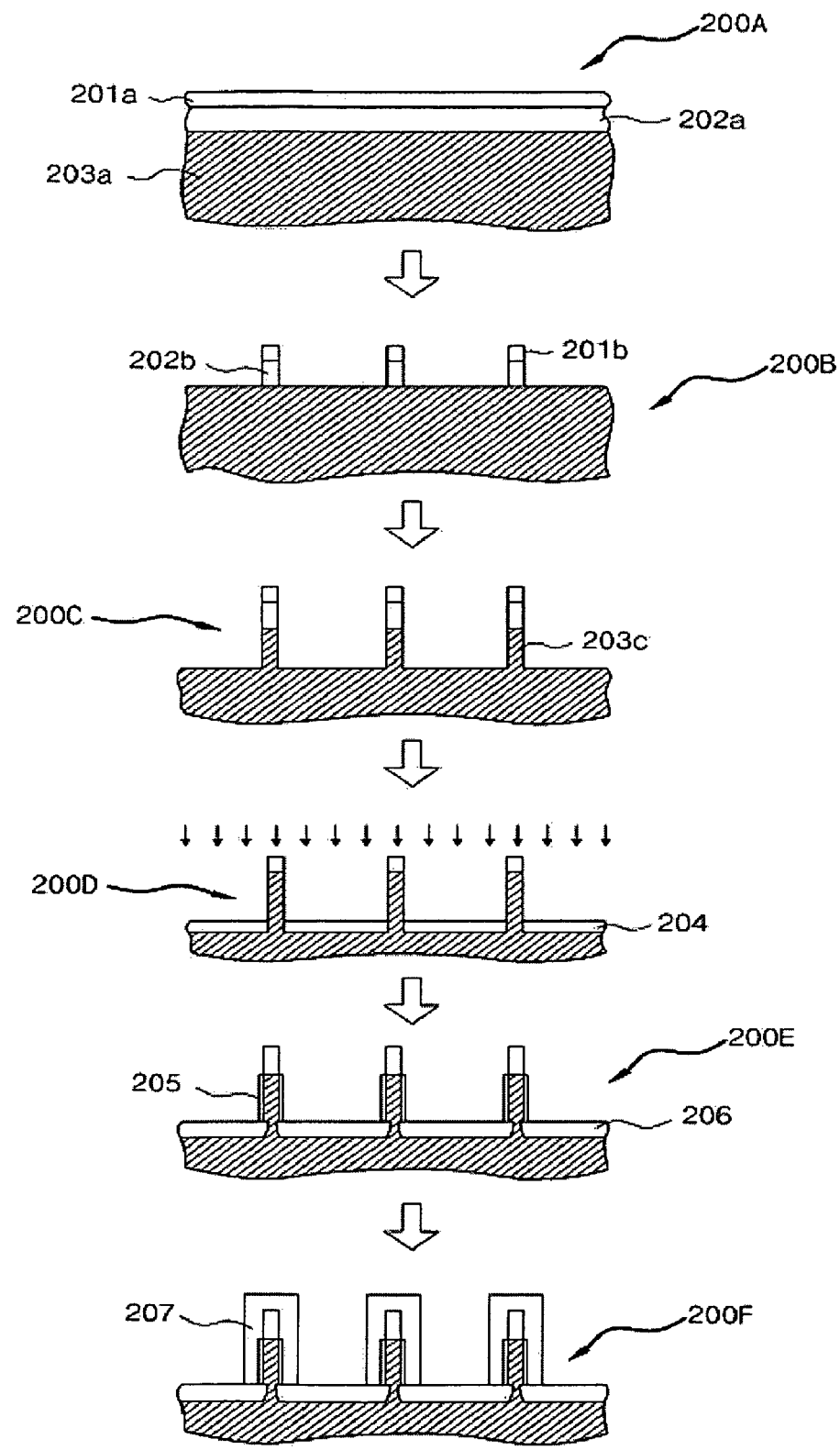
FIG. 2 is a process cross-sectional view showing a method for manufacturing fin field-effect transistors using a bulk substrate according to the prior art.
Figure 3:
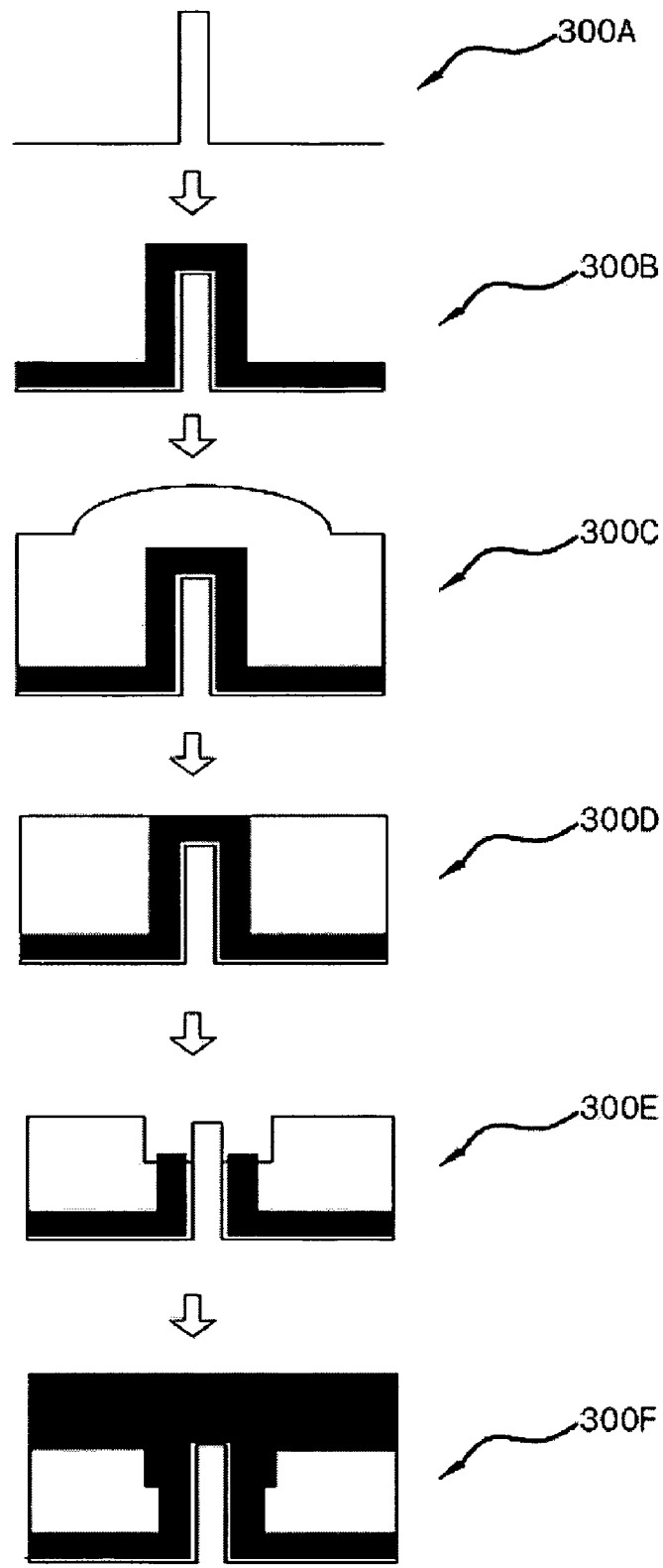
FIG. 3 is a process cross-sectional view showing a prior art method for manufacturing an omega fin field-effect transistor using a bulk substrate according to the prior art.
Figure 4A:
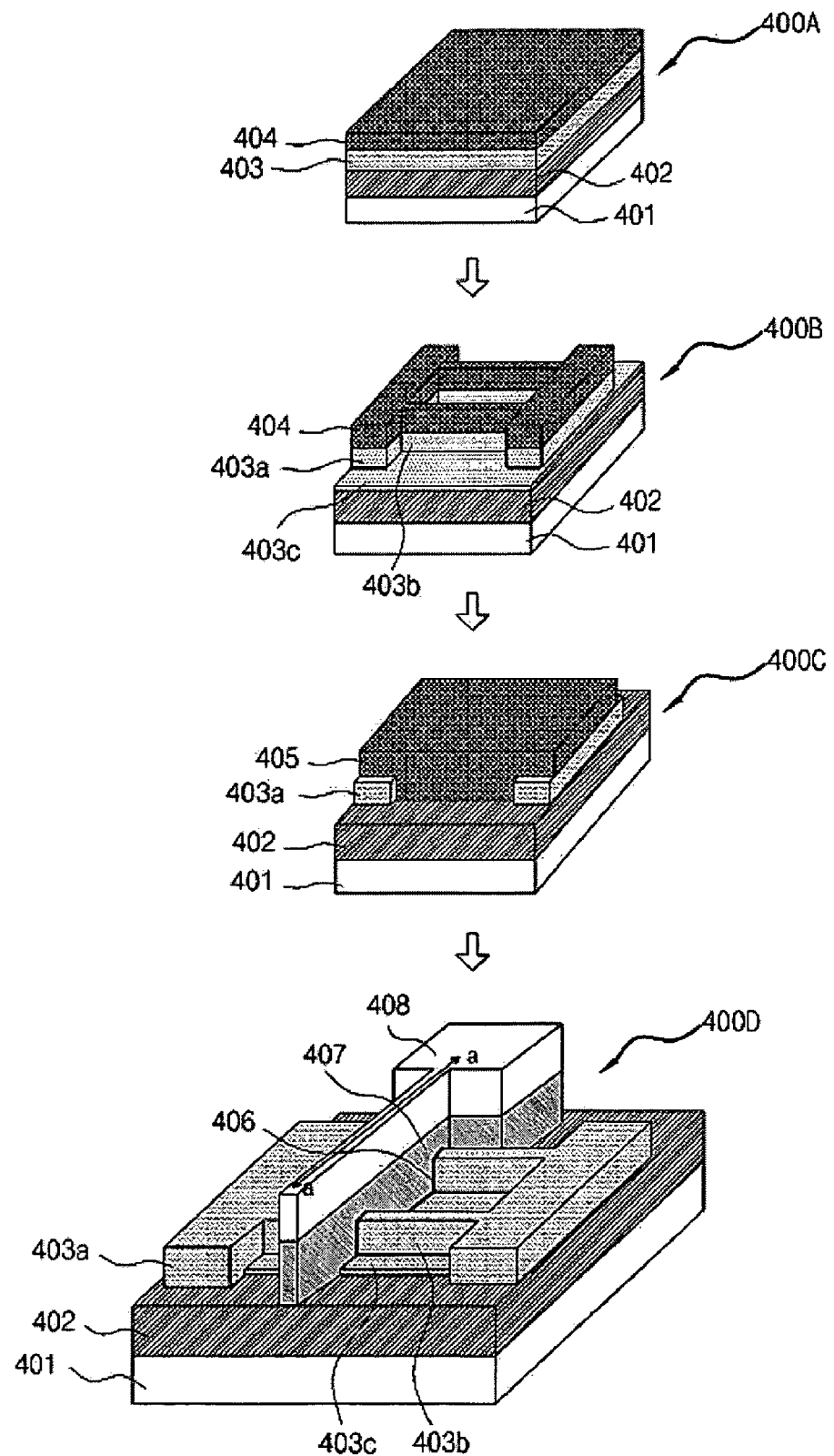
FIG. 4a is a process perspective view sequentially showing a method for manufacturing a field effect transistor having a channel consisting of silicon fins and a silicon body, according to Embodiment 1 of the present invention.

FIG. 4a is a process perspective view sequentially showing a method for manufacturing a field effect transistor comprising a channel consisting of silicon fins and a silicon body.

First, an SOI substrate comprising a silicon substrate 401, a buried oxide film 402 and a silicon thin film 403 formed on the buried insulation film 402 is provided. On the silicon thin film 403, a hard mask 404 is formed which is made of a material which will not be etched in subsequent anisotropic or isotropic etching of the silicon thin film (400A).

In this step, the hard mask 404 may also be formed on a silicon bulk substrate instead of the SOI substrate comprising the silicon substrate 401, the burred oxide film 402 and the silicon thin film 403.

Then, the silicon thin film 403 is anisotropically etched using the mask pattern 404 as a mask to form a silicon fins 403 where a channel is to be formed, and a silicon pattern 403a where a source/drain region is to be formed. Also, the silicon thin film is etched to a predetermined thickness to form a silicon body where a channel is to be formed. Namely, the thickness of the silicon thin film etched is so controlled that a thin silicon body 403c remains between the silicon fins.

After anisotropically etching the silicon thin film 403 to a predetermined thickness to form the silicon body, the step of either making the etched silicon surface uniform or performing hydrogen annealing to reduce corner effects may further be carried out.

As described above, by leaving the silicon body having a given thickness between the silicon fins, the silicon fins and the silicon body have different crystal orientations. Thus, the use of these planes as a channel allows current to be maximized.

Also, by leaving the silicon body having a given thickness between the silicon fins, the channel width of the resulting device is increased or the easiness of correction of the device channel width is ensured.

Also, by leaving a discrete silicon body having a given thickness between the silicon fins, the device channel width is increased, an electric current flowing through a channel formed by the silicon body having an orientation different from the silicon fins is increased, and the easiness of correction of the device channel width is ensured.

After that, the silicon thin film is partially etched using an active mask 405 so as to isolate a source/drain region and the device from each other (400C).

Then, the mask pattern is removed to leave a thin silicon thin film 403 on the buried oxide film 402.

The partial etching of the silicon thin film 403 on the buried oxide film 402 is performed through anisotropic or isotropic etching using the active mask.

Next, a gate dielectric film 406 is grown around the channel of the silicon thin film 403, and a gate material 407 and a gate mask 408 are sequentially deposited on the resulting structure, followed by forming a gate region.

In this step, a multiple gate covering at least two sides of each of the silicon fins is formed.

In this way, it is possible to manufacture the inventive field effect transistor in which the silicon fins and the silicon body are formed to serve as a channel.

Embodiment 2

Embodiment 2 of the present invention is the same as Embodiment 1 except that, after conducting the step (400C) of etching the silicon body using the active mask 405 so as to isolate the source/drain region and the device from each other, the step (400B) of forming the silicon fins using the hard mask 400 is conducted. Accordingly, a drawing showing the second embodiment will be omitted herein.

Figure 4B:
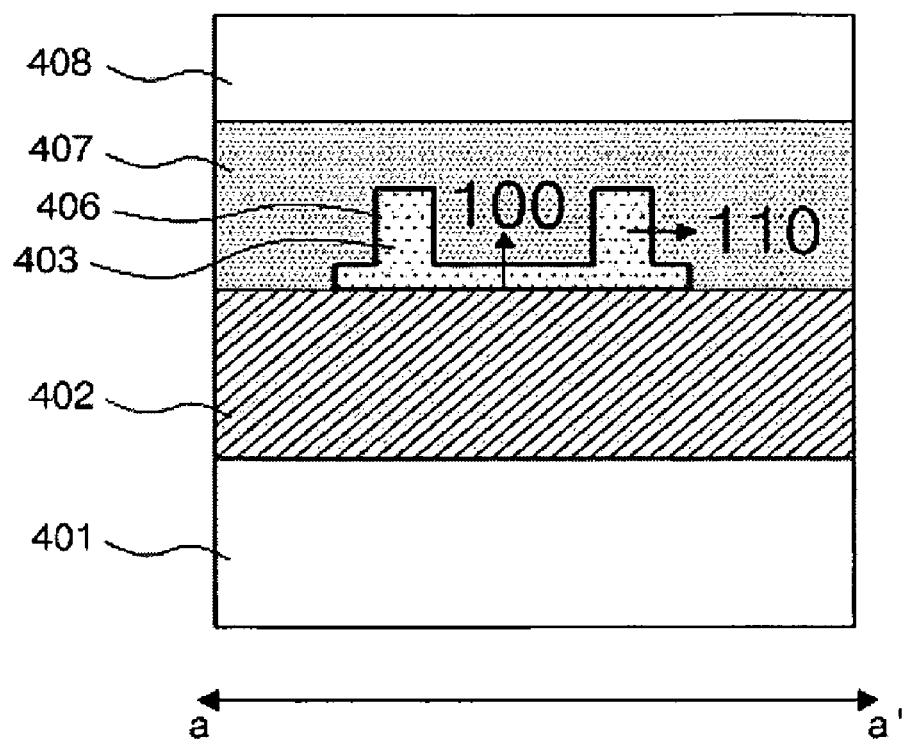

FIG. 4b is an a-a' cross-sectional view of the device manufactured by the method shown in FIG. 4a.

As can be seen in FIG. 4b, the silicon fins and the silicon body serve as a channel, the orientation of the silicon fins is (110), and the orientation of the silicon body is (100).

In the case of NMOS according to one embodiment of the present invention, a reduction in electric current by the mobility of electrons in the silicon fins having an orientation of (110) is compensated not only by the effect of an increase in the device channel width in the silicon body but also by an increase in mobility caused by the orientation of the silicon body.

Also, in the case of PMOS, although the advantage of an increase in current values by the orientation of the silicon body disappears because the mobility of holes in the (110) orientation is greater than in the (100) orientation of the silicon body, an electric current will be compensated by the effect of an increase in the device channel width.

Embodiment 3

Figure 5:
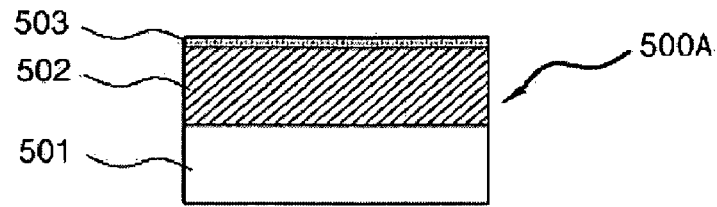
FIG. 5 is a process perspective view sequentially showing a method for manufacturing a field effect transistor having a channel consisting of silicon fins and a silicon body, according to Embodiment 3 of the present invention.
Figure 5:
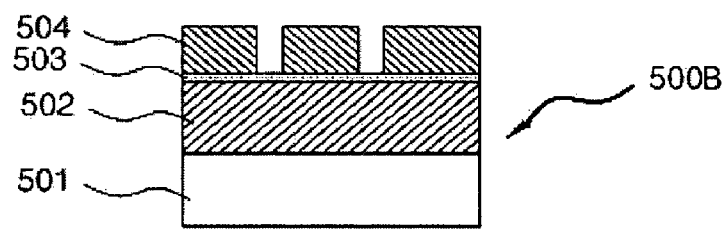
Figure 5:
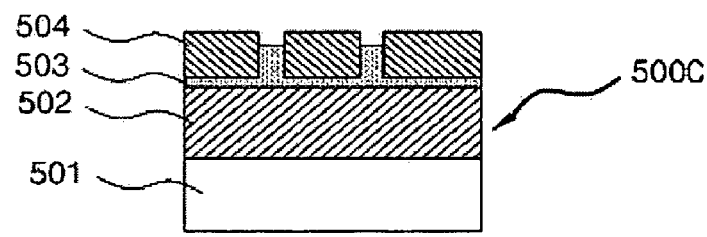
Figure 5:
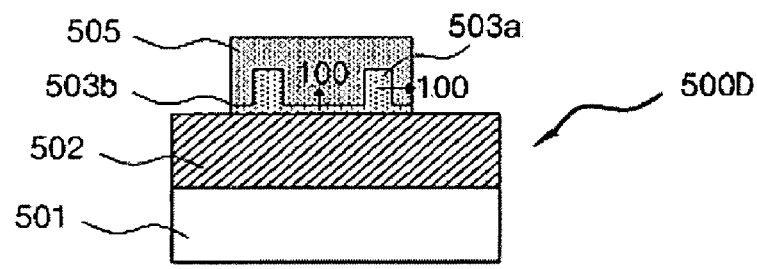
Figure 5:
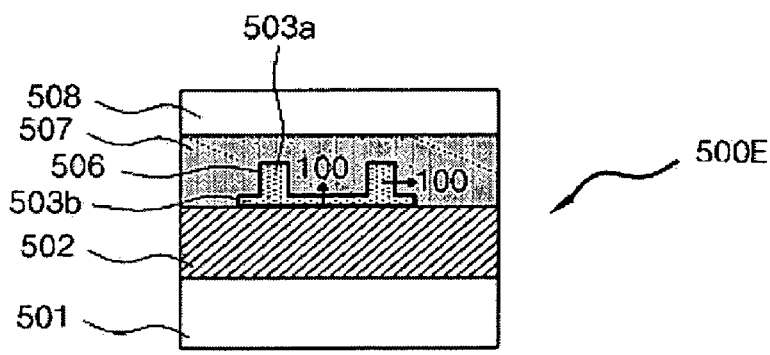

FIG. 5 is a process cross-sectional view sequentially showing a method for manufacturing a field effect transistor having a channel consisting of silicon fins and a silicon body, according to Embodiment 3 of the present invention.

First, an SOI substrate comprising a silicon substrate 501, a buried oxide film 502 and a silicon thin film 503 on the buried oxide film 502 is provided (500A).

In this step, a silicon bulk substrate may also be used instead of the SOI substrate comprising the silicon substrate 501, the buried oxide film 502 and the silicon thin film 503.

Then, an oxide film 504 is formed on the silicon thin film 503 and etched and patterned using a mask so as to form portions where silicon fins are to be formed (500B).

In this step, other materials than the oxide film may also be deposited or grown on the silicon thin film 503 and then etched using a mask.

Next, selective epitaxial growth of silicon is used to form silicon fins 503a (500C).

In this step, the silicon fins 503a are formed on the silicon body 503b so that the silicon fins 503a and the silicon body 503b have different orientations. Thus, the use of these planes as a channel allows an electric current to be maximized.

Also, by forming the silicon fins on the silicon body, the channel width of the device is increased or the easiness of correction of the device channel in the device layout is ensured.

After that, the oxide film 504 is removed, and the silicon thin film is partially etched using an active mask 505 so as to isolate a source/drain region and the device from each other (500D).

In this regard, after removing the oxide film 504, the step of making the exposed silicon surface uniform or performing hydrogen annealing to reduce corner effects may further be included.

The partial etching of the silicon thin film 503 on the buried oxide film is carried out through anisotropic or isotropic etching using an active mask.

Next, a gate dielectric film 506 is grown around the silicon channel, and a gate material 507 and a gate mask 508 are sequentially deposited on the resulting structure, followed by forming a gate region.

In this step, a multiple gate covering at least two sides of each of the silicon fins is formed.

In this way, it is possible to manufacture the field effect transistor in which the silicon fins and the silicon body are formed to serve as a channel, according to Embodiment 3 of the present invention.

Embodiment 4

Embodiment 4 of the present invention is the same as Embodiment 3 except that, after conducting the step (500D) of etching the silicon body using the active mask 505 so as to isolate the source/drain region and the device from each other, the step (500C) of forming the oxide film 504 on the silicon thin film 503 and etching the oxide film 504 using the mask to portions where the silicon fins are to be formed and then forming the silicon fins by selective epitaxial growth of silicon is conducted. Thus, a drawing showing Embodiment 4 will be omitted herein.

Embodiment 5

Figure 6:
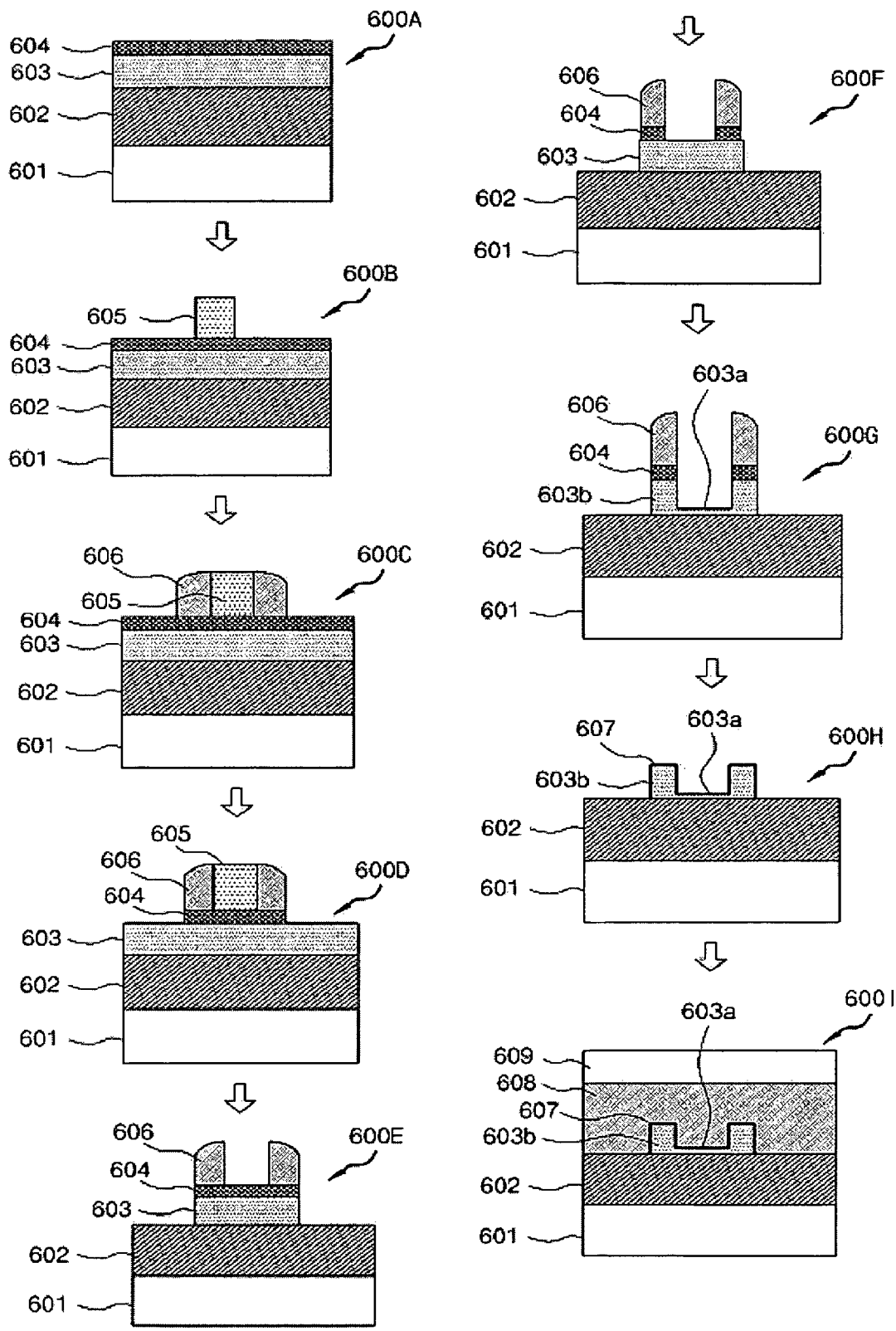
FIG. 6 is a process perspective view sequentially showing a method for manufacturing a field effect transistor having a channel consisting of silicon fins and a silicon body, according to Embodiment 5 of the present invention.

FIG. 6 is a process perspective view sequentially showing a method for manufacturing a field effect transistor comprising a channel consisting of silicon fins and a silicon body having an orientation different from the silicon fins, according to Embodiment 5 of the present invention. In this embodiment, the silicon fins are formed using spacers.

First, an SOI substrate comprising a silicon substrate 601, a buried oxide film 602 and a silicon thin film 603 on the buried oxide film 602 is provided. Then, on the substrate, a hard mask 604 is formed (600A). The hard mask 604 is preferably made of a material which is not etched in silicon anisotropic etching.

On the hard mask, a polysilicon pattern 605 is formed so that silicon fins can later be formed using spacer lithography (600B).

On both sides of the polysilicon pattern 605, oxide films 606 are deposited and etched to form sidewalls (600C).

Then, the hard mask 604 is etched so as to expose the silicon thin film 603.

For the formation of silicon fins, the hard mask 604 is partially etched (600F).

For the formation of silicon fins, the silicon thin film 603 is anisotropically etched using the oxide sidewalls 606 and the hard mask 604 as masks so as to form silicon fins where a channel is to be formed later (600G). In this step, the thickness of the silicon thin film etched is so controlled that a thin silicon body 603a remains between the silicon fins 603b.

After removing the oxide sidewalls 606 and the hard mask 605, a gate dielectric film 607 is formed on the silicon fins and the silicon body (600H).

After growing the gate dielectric film 607, a gate material 608 and a gate mask 609 are sequentially deposited on the resulting structure, followed by forming a gate region (600I).

In this step, the mask 609 is preferably made of a material which is not etched in anisotropic etching of the gate material.

Embodiment 6

Figure 7:
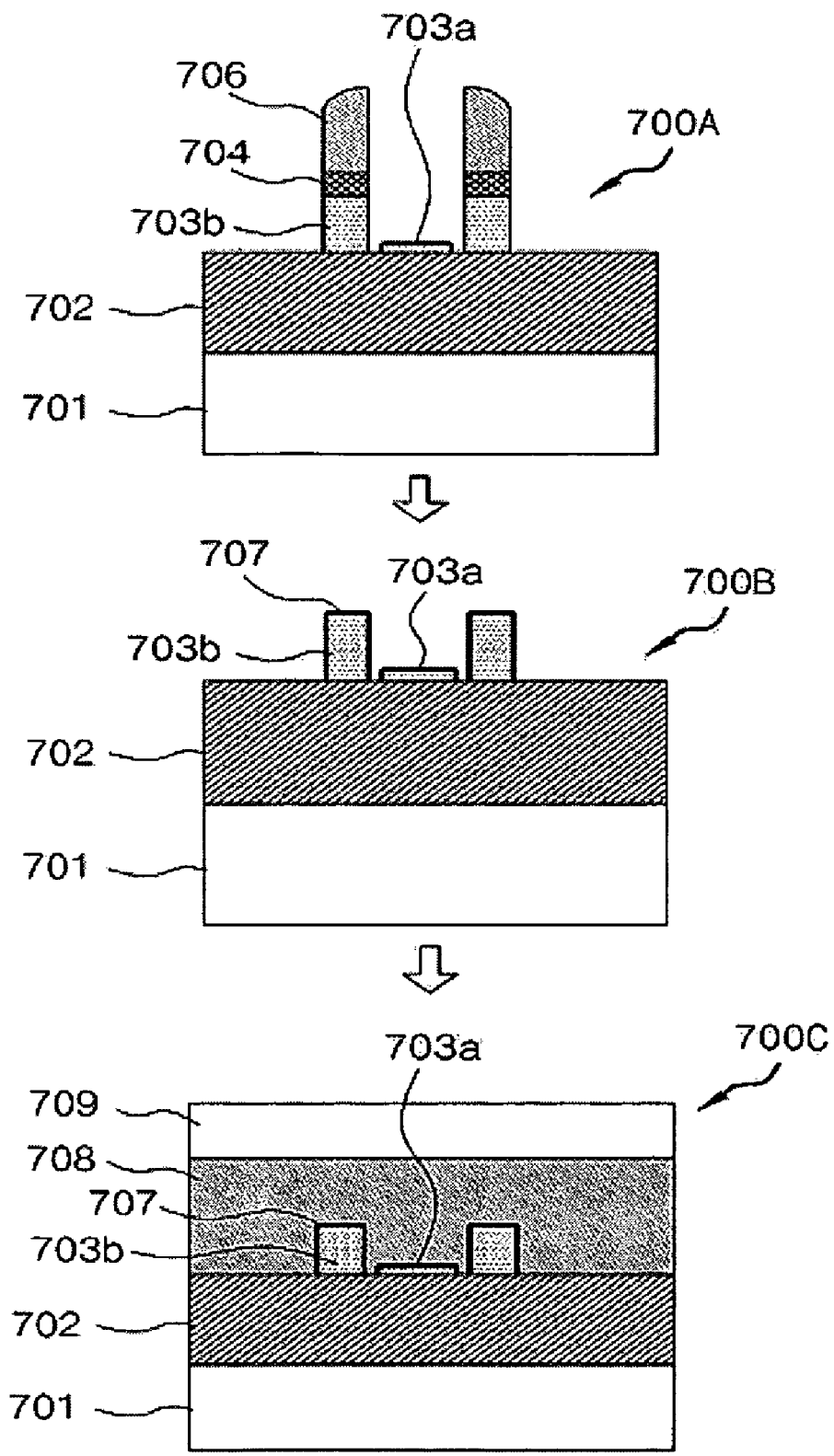
FIG. 7 is a process perspective view sequentially showing a method for manufacturing a field effect transistor having a channel consisting of silicon fins and a silicon body, according to Embodiment 6 of the present invention.

FIG. 7 is a process perspective view sequentially showing a method for manufacturing a field effect transistor comprising a channel consisting of silicon fins and a silicon body having an orientation different from the silicon fins, according to Embodiment 6 of the present invention. In this embodiment, the silicon fins and the silicon body are isolated from each other.

First, some steps of the methods shown in FIGS. 4a and 6 are conducted. Namely, the steps 400A and 400B in FIG. 4a and the steps 600A-600G in FIG. 6 are conducted (700A).

In the step of forming the silicon fins 703b and the silicon body 703a, etching conditions are so controlled that the silicon fins 703b and the silicon body 703a are isolated from each other. Then, a gate dielectric film 707 is grown on the silicon fins and the silicon body (700B).

After growing the gate dielectric film 707, a gate material 708 and a gate mask 709 are sequentially deposited on the resulting structure, followed by forming a gate region, thus manufacturing a field effect transistor. In this step, the mask 709 is preferably made of a material which is not etched in subsequent anisotropic etching of the gate material.

Figure 8:
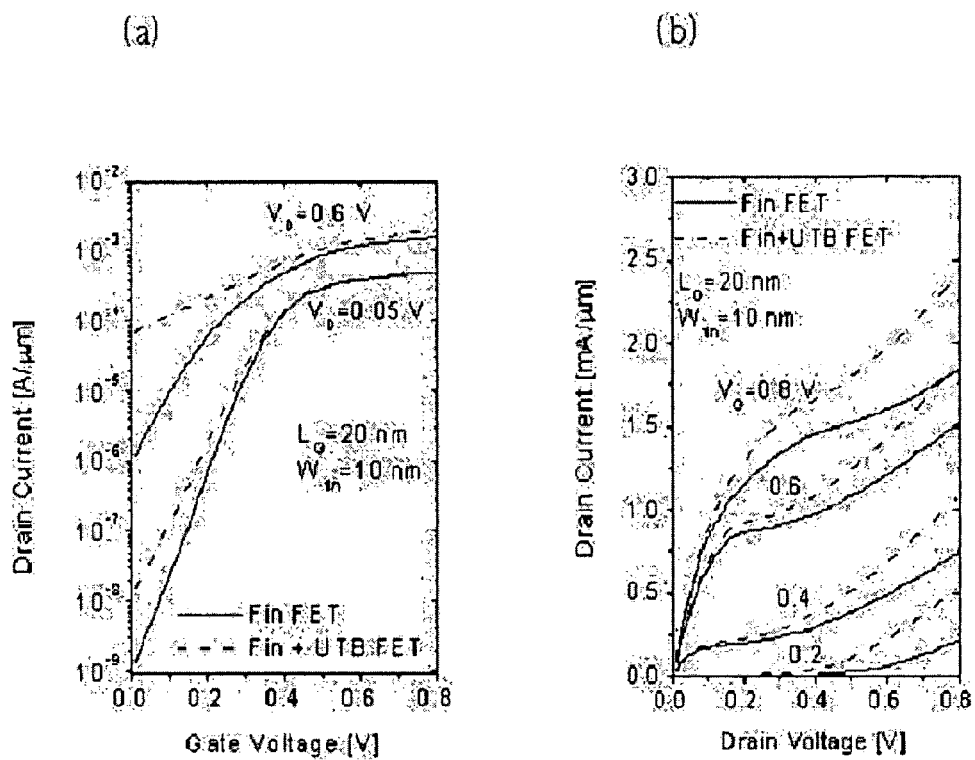
FIG. 8 is a graphic diagram showing the comparison of current-voltage characteristics between a field effect transistor according to one embodiment of the present invention and the prior field effect transistor.

FIG. 8 is a graphic diagram showing the comparison of current-voltage characteristics between a field effect transistor according to one embodiment of the present invention and the prior field effect transistor.

Specifically, FIG. 8a is a graphic diagram showing the simulation results for the comparison of drain current-gate voltage between the prior field effect transistor where silicon fins are used as a channel, and a field effect transistor according to one embodiment of the present invention, where silicon fins and a silicon body are used as a channel.

FIG. 8b is a graphic diagram showing the simulation results for the comparison of drain current-gate voltage between the prior field effect transistor where silicon fins are used as a channel, and a field effect transistor according to another embodiment of the present invention, where silicon fins and a silicon body are used as a channel.

As can be seen in FIGS. 8a and 8b, the current value of the inventive field effect transistor comprising the channel consisting of the silicon fins and the silicon body is higher than that of the prior field effect transistor comprising the channel consisting of silicon fins.

Also, in view of the effect caused by the orientation of the silicon body, the inventive field effect transistor structure having the channel consisting of the silicon fins and the silicon body will further be increased.

Figure 9:
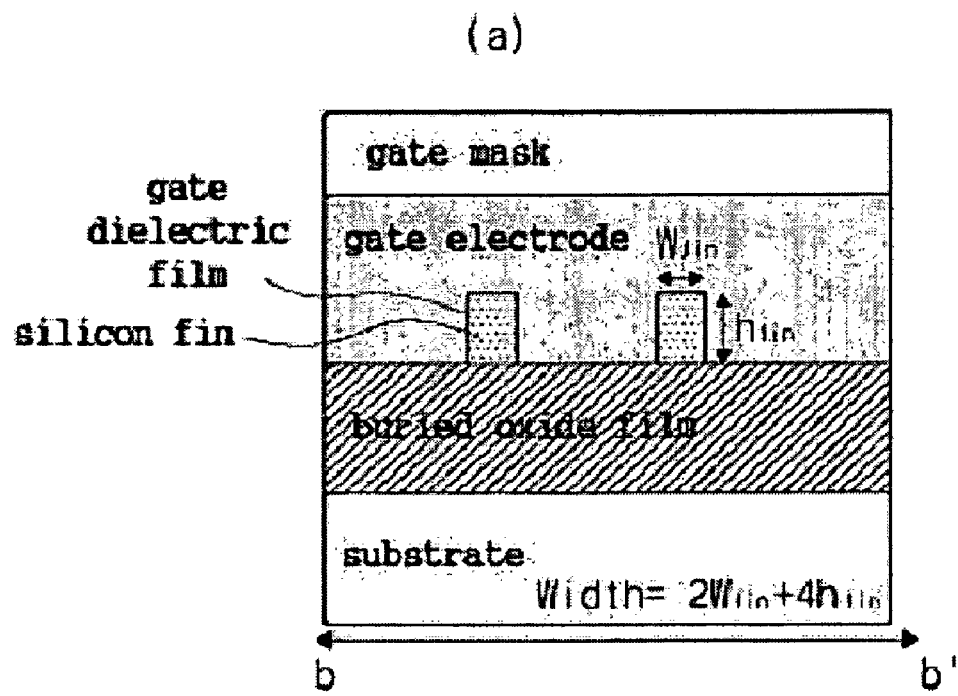
FIG. 9 is a cross-sectional view showing the comparison of channel width between a field effect transistor according to one embodiment of the present invention and the prior field effect transistor.
Figure 9:
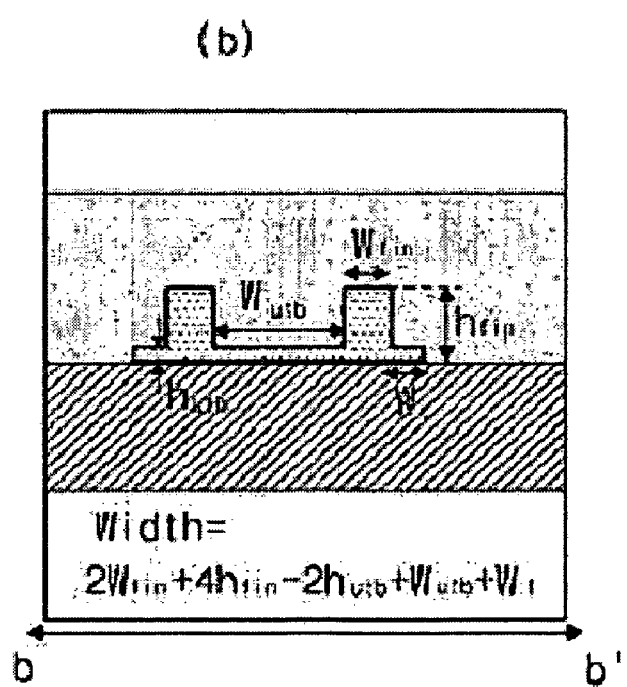

FIG. 9 is a cross-sectional view showing the comparison of channel width between the inventive field effect transistor and the prior field effect transistor.

Specifically, FIG. 9a is a cross-sectional view showing the gate of the prior field effect transistor having the channel consisting of the silicon fins, and FIG. 9b is a cross-sectional view showing the gate of the inventive field effect transistor having the channel consisting of the silicon fins and the silicon body.

In FIGS. 9a and 9b, $W_{fin}$ denotes the width of each silicon fin, $h_{fin}$ denotes the height of each silicon fin, $W_{utb}$ denotes the width of the silicon body, $h_{utb}$ denotes the height of the silicon body, and $W_t$ denotes the width of the silicon body extension.

The channel width of the prior transistor having the channel consisting of the silicon fins is shown as $2W_{fin}+4h_{fin}$, and the channel width of the inventive transistor having the channel consisting of the silicon fins and the silicon body is shown as $2W_{fin}+4h_{fin}-2h_{utb}+W_{utb}+2W_t$.

Because the parameters $W_{fin}$, $2h_{utb}$, $h_{fin}$ and $w_t$ are determined values, the correction of the device channel width in the device layout requires a complicated correction procedure by the number of the silicon fins in the case of the prior structure having the channel consisting of the silicon fins. On the other hand, in the case of the inventive structure having the channel consisting of the silicon fins and the silicon body, the correction of the device channel width can be simply achieved by the change of $W_{utb}$.

As described above, the inventive method for manufacturing the field effect transistor comprising the channel consisting of the silicon fins and the silicon body, which have different orientations, allows a device having improved characteristics to be manufactured in a simple and reproducible manner. Thus, the inventive method can greatly contribute the continuous reduction of the size of semiconductor devices.

Also, the inventive method is highly practical technology utilizing the current semiconductor processing, and makes it possible to solve the problems of low current values and difficult correction of the device channel width in the device layout, which are pointed as problems in the prior fin field effect transistor.

In addition, because the inventive method allows the size of semiconductor devices to be continuously reduced, it will contribute to the future development of the semiconductor industry.

Although preferred embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A method for manufacturing a field effect transistor having a channel consisting of silicon fins and a silicon body, the method comprising the steps of:
   (a) forming a hard mask pattern on a substrate comprising a silicon thin film;
   (b) anisotropically etching the silicon thin film to a predetermined thickness using the hard mask pattern as a mask to form silicon fins where a channel is to be formed, to form a silicon pattern where a source/drain region is to be formed and to form a silicon body that connects the silicon fins to each other to form the channel;
   (c) partially etching the silicon thin film using an active mask to isolate the source/drain region from the device; and
   (d) growing a gate dielectric film around the silicon channel and sequentially depositing a gate material and a gate mask on the resulting structure, followed by forming a gate region.

2. The method of claim 1, wherein the substrate comprising the silicon thin film, used in the step (a), is selected from the group consisting of an SOI(Silicon-on-insulator) substrate, a silicon bulk substrate, a strained silicon substrate and an SiGe substrate.

3. The method of claim 1, which further comprises, after the step (b) of forming the silicon body by etching, the step of using hydrogen annealing to make the surface of the etched silicon thin film uniform to reduce corner effects.

4. The method of claim 1, wherein the etching in the step (c) is performed by anisotropic or isotropic etching.

5. The method of claim 1, wherein the gate in the step (d) is a multiple gate covering at least two sides of each of the silicon fins.

* * * * *